United States Patent
Hovis et al.

(10) Patent No.: US 10,268,248 B2
(45) Date of Patent: Apr. 23, 2019

(54) POWER BASED THERMAL MANAGEMENT OF DEVICE

(71) Applicant: Microsoft Technology Licensing, LLC, Redmond, WA (US)

(72) Inventors: William Paul Hovis, Sammamish, WA (US); Andres Hernandez, Seattle, WA (US); Peter Atkinson, Sammamish, WA (US); Gregory M. Daly, Seattle, WA (US); Garrett Blankenburg, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 126 days.

(21) Appl. No.: 15/425,896

(22) Filed: Feb. 6, 2017

(65) Prior Publication Data

US 2018/0032114 A1 Feb. 1, 2018

Related U.S. Application Data

(60) Provisional application No. 62/369,687, filed on Aug. 1, 2016.

(51) Int. Cl.
| | | |
|---|---|---|
| *G06F 1/20* | (2006.01) | |
| *G05B 15/02* | (2006.01) | |
| *H05K 7/20* | (2006.01) | |

(52) U.S. Cl.
CPC .............. *G06F 1/206* (2013.01); *G05B 15/02* (2013.01); *H05K 7/20172* (2013.01); *H05K 7/20209* (2013.01); *H05K 7/20836* (2013.01)

(58) Field of Classification Search
CPC .................... G06F 1/20; G06F 1/206
See application file for complete search history.

(56) References Cited

U.S. PATENT DOCUMENTS

| | | |
|---|---|---|
| 5,848,282 A | 12/1998 | Kang |
| 6,654,894 B2 | 11/2003 | Kaminski et al. |

(Continued)

FOREIGN PATENT DOCUMENTS

CN 204267317 U 4/2015

OTHER PUBLICATIONS

"International Search Report and Written Opinion Issued in PCT Application No. PCT/US2017/043574", dated Oct. 23, 2017, 14 Pages.

(Continued)

*Primary Examiner* — Mark A Connolly
(74) *Attorney, Agent, or Firm* — Alleman Hall Creasman & Tuttle LLP

(57) ABSTRACT

A method for controlling a cooling system for a device includes determining a power load of the processing system, determining a power load of the device, setting a first thermal setpoint based at least in part on the power load, determining a temperature of the device, adjusting a response of the cooling system based at least in part on the first thermal setpoint, detecting a change in the power load of the device to a higher power load having a higher magnitude acoustic response, in response to detecting the change in the power load, setting a second thermal setpoint having a lower magnitude acoustic response at the higher power load, the second thermal setpoint being based at least in part on a determined second corresponding acoustic response curve, and adjusting the response of the cooling system based at least in part on the second thermal setpoint.

19 Claims, 4 Drawing Sheets

(56) References Cited

U.S. PATENT DOCUMENTS

| | | |
|---|---|---|
| 6,836,849 B2 | 12/2004 | Brock et al. |
| 6,996,441 B1 | 2/2006 | Tobias |
| 7,138,781 B2 | 11/2006 | Murray et al. |
| 7,591,433 B2 | 9/2009 | Wang et al. |
| 7,890,215 B2 | 2/2011 | Duncan |
| 7,991,515 B2 | 8/2011 | Lyon et al. |
| 8,230,245 B2 | 7/2012 | Khatri et al. |
| 8,253,364 B2 | 8/2012 | Chen et al. |
| 8,387,890 B2 | 3/2013 | Crocker et al. |
| 8,594,856 B2 | 11/2013 | Alon |
| 2002/0067368 A1* | 6/2002 | Colligan .............. G06F 3/04847 715/716 |
| 2003/0000684 A1* | 1/2003 | Huang ...................... G06F 1/20 165/104.33 |
| 2003/0011984 A1 | 1/2003 | Chu et al. |
| 2003/0015983 A1* | 1/2003 | Montero ................. G06F 1/206 318/473 |
| 2007/0230113 A1* | 10/2007 | Chiang ................... G06F 1/181 361/679.47 |
| 2012/0041597 A1* | 2/2012 | Wei ........................ G05D 23/19 700/275 |
| 2014/0032011 A1 | 1/2014 | Artman et al. |
| 2015/0064639 A1 | 3/2015 | Dumbreck |

OTHER PUBLICATIONS

Kim, et al., "Global Fan Speed Control Considering Non-Ideal Temperature Measurements in Enterprise Servers", In Proceedings of Design, Automation & Test in Europe Conference & Exhibition, Mar. 24, 2014, 6 pages.

Lee, et al., "Optimal Self-Tuning PID Controller Based on Low Power Consumption for a Server Fan Cooling System", In Journal of Sensors, vol. 15, Issue 5, May 20, 2015, pp. 11685-11700.

\* cited by examiner

POWER BASED THERMAL MANAGEMENT OF DEVICE

CROSS REFERENCE TO RELATED APPLICATIONS

This application claims priority to U.S. Provisional Patent Application No. 62/369,687, filed Aug. 1, 2016, the entirety of which is hereby incorporated herein by reference.

BACKGROUND

An electronic device, such as a computing device, may produce excess heat during operation. For example, the amount of heat produced by the electronic device may be based at least in part on an amount of power input to the electronic device. In some cases, excess heat generated by the electronic device can cause the device to be unreliable and/or cause device failure. Accordingly, the electronic device may include a cooling system to thermally regulate the device during operation.

SUMMARY

Examples are disclosed that relate to controlling a cooling system for a device according to a control scheme that utilizes multiple thermal setpoints that are dynamically set based at least in part on a power load of the device. One example provides a method for controlling a cooling system for a device includes determining a power load of the processing system, determining a power load of the device, setting a first thermal setpoint based at least in part on the power load, determining a temperature of the device, adjusting a response of the cooling system based at least in part on the first thermal setpoint, detecting a change in the power load of the device to a higher power load having a higher magnitude acoustic response on the first corresponding acoustic response curve, in response to detecting the change in the power load to the higher power load, setting a second thermal setpoint having a lower magnitude acoustic response at the higher power load, the second thermal setpoint being based at least in part on a determined second corresponding acoustic response curve, and adjusting the response of the cooling system based at least in part on the second thermal setpoint.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
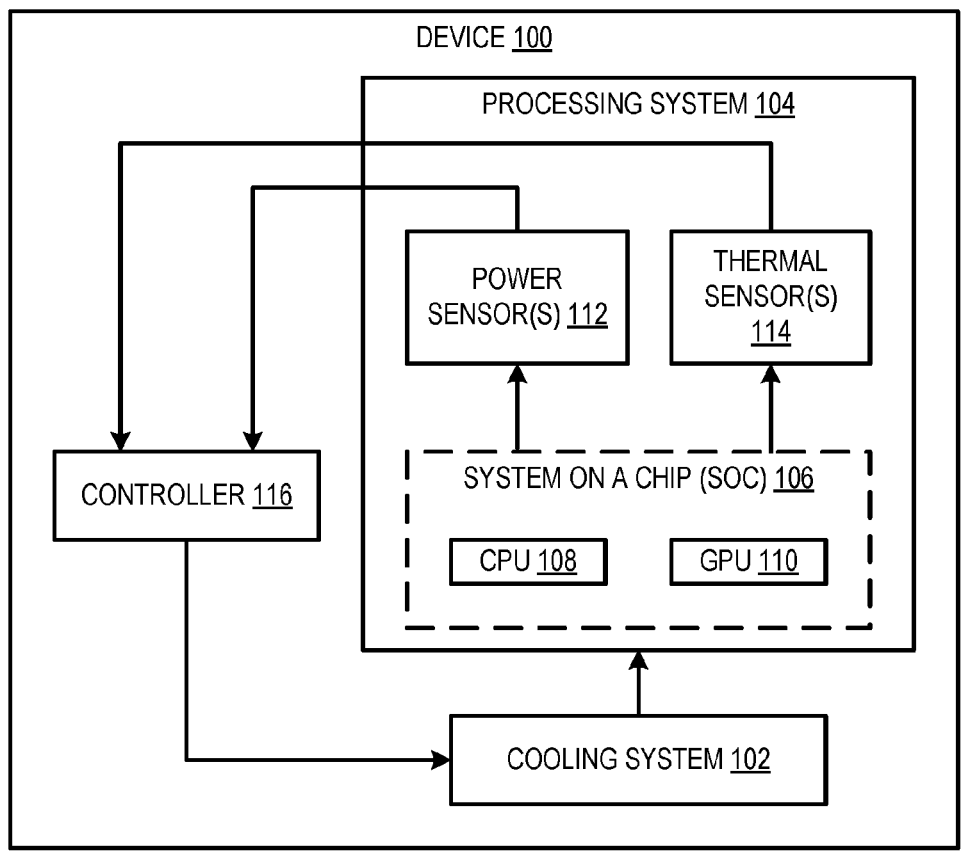
FIG. 1 shows a block diagram of an example computing system.

An electronic device may include a cooling system to thermally regulate the device. Typically, a cooling system may be configured to cool an electronic device based at least in part on a single thermal setpoint during operation of the device. The use of a single setpoint may impact device operation in various instances. For example, when the thermal setpoint is set to a relatively lower temperature, during some operating conditions (e.g., when performing processor intensive operations), the cooling system may have to respond more frequently, or reduce processing capability, based at least in part on the relatively lower setpoint. Further, where the cooling system uses a fan, the relatively lower setpoint may result in more noise from fan operation.

On the other hand, when the thermal setpoint is set to a relatively higher temperature, the device is allowed to become hotter. However, by operating the device continuously at the higher thermal setpoint, an operational lifespan of the device may be shortened relative to operation of the device using a lower setpoint, because reliability of the heat-producing components of the device may be impacted by operating the device using the higher setpoint.

Furthermore, in single setpoint systems, a response of the cooling system can often overshoot the thermal setpoint during fast thermal transient conditions (e.g., when an idle processor is placed under a high processing load). As such, a single setpoint system may have a lower thermal setpoint to help avoid the occurrence of such overshooting.

Accordingly, examples are disclosed that relate to controlling a cooling system for a device according to a control scheme that utilizes multiple thermal setpoints that are dynamically set based at least in part on a power load of the device. In some examples, the different thermal setpoints may be based at least in part on different determined corresponding acoustic response curves of the cooling system. As used herein, an "acoustic response curve" refers to a curve on a graph that plots cooling system acoustics versus another operating parameter of the device (e.g., power load). The curve represents the acoustic behavior of the cooling system over a range of the other operating parameter. As described in more detail below, when controlling the cooling system, a power load of the device may be determined, and a first thermal setpoint is set based at least in part on the power load. Further, a temperature of the device is determined, and a response of the cooling system may be adjusted based at least in part on the first thermal setpoint. Next, a change in the power load of the device, e.g., to a higher power load is detected. In response to detecting the change in the power load to the higher power load, a second thermal setpoint having a lower magnitude acoustic response at the higher power load is set. Then, the response of the cooling system is adjusted based at least in part on the second thermal setpoint.

In implementations where the cooling system includes mechanical components (e.g., one or more fans), the first thermal setpoint may have a first corresponding acoustic response curve as a function of power load, and the second thermal setpoint may have a second, different corresponding acoustic response curve. As an example, fan noise may be louder for a given temperature when using the first thermal setpoint compared to the second thermal setpoint. As such, the first and second thermal setpoints may be selected based at least in part on the corresponding acoustic response curves to impart desired acoustic characteristics to the device over a range of possible operating temperatures.

Using multiple setpoints also may help to avoid overshooting during fast thermal transients, because the thermal setpoint at the lower power load may be substantially below the thermal setpoint at the higher power load. Such a separation between thermal setpoints allows an overshoot that occurs outside of the fan control response speed to stay underneath the desired thermal setpoint at the higher power load.

FIG. 1 shows a block diagram of an example device 100 that may be thermally regulated by a cooling system 102 in the manner discussed above. The device 100 is shown in simplified form. The device 100 may take any suitable form, including, but not limited to a personal computing device, a server computing device, a tablet computing device, a laptop computing device, a home-entertainment computing device, a network computing device, a data center computing device, a gaming device, a mobile computing device, a mobile communication device (e.g., smart phone), and/or any other electronic device that can be thermally regulated by a cooling system.

In the depicted example, the device 100 includes a processing system 104. The processing system 104 includes a central processing unit (CPU) 108 and a graphics processing unit (GPU) 110. In other examples, the CPU and GPU may be separate devices, or integrated together in a system on a chip (SOC) 106. When performing computing operations, a power load is placed on the CPU 108 and/or GPU 110. One or more power sensors 112 are configured to measure the power load and report the measured power load to a controller 116.

In one example, the power sensors 112 are integrated into a voltage regulator of the CPU 108 and/or the GPU 110. As such, the controller 116 may be configured to estimate an overall power load based at least in part on power load information for the CPU 108 and the GPU 110. As one example, in the case of the depicted SOC, the power load may be characterized by measuring all SOC power rails across SOC process corners and power loads to determine a linear fit function that estimates the total SOC power load by using only the power load information of the CPU 108 and the GPU 110 as inputs to the function.

Device 100 also includes one or more thermal sensors 114 configured to measure the temperature of heat-producing components (e.g., CPU 108, GPU 110, or SOC 106) and report the measured temperature to the controller 116. Thermal monitoring of such components may be used for control of the cooling system 102, as an input for power management, and/or to prevent a runaway condition that can lead to component overheating. In one example, the one or more thermal sensors 114 include diodes placed at different locations of the depicted components to measure different electrical junction temperatures. It will be understood that the power sensors 112 may be configured to measure any suitable power characteristic (e.g., voltage, current, power) of any suitable portion (e.g., CPU, GPU, cooling system, interior of housing, exhaust ports,) of the device 100, and the thermal sensors 114 may be configured to measure temperature characteristics of any suitable portion of the device 100.

The controller 116 may be configured to receive power load information from the power sensors 112 and temperature information from the thermal sensors 114. In one example, the controller 116 is configured to determine the power load as a moving average of a plurality of power load samples acquired during a designated duration (e.g., a window of 5 samples). Further, the controller 116 may be configured to set a thermal setpoint based at least in part on the determined power load. The thermal setpoint dictates a temperature at which the processing system 104 operates. The controller 116 may be configured to adjust a response of the cooling system 102 based at least in part on the thermal setpoint. In particular, the controller 116 controls the cooling system 102 to provide a response that cools the heat-producing components as necessary based at least in part on the thermal setpoint.

The controller 116 is configured to monitor the power load. When the power load becomes greater than a threshold power load, the controller 116 is configured to change the thermal setpoint to a higher thermal setpoint based at least in part on the increased power load, and the controller 116 is configured to adjust the response of the cooling system 102 based at least in part on the higher thermal setpoint. On the other hand, when the power load becomes less than a threshold power load, the controller 116 is configured to set a lower thermal setpoint based at least in part on the decreased power load, and the controller 116 is configured to adjust the response of the cooling system 102 based at least in part on the lower thermal setpoint. The different threshold power loads may be set to any suitable values and may be spaced apart from one another by any suitable magnitude.

In some implementations, the thermal setpoint may be adjusted based at least in part on one or more parameters other than, or in addition to, power load. For example, a number of activities/threads/processes performed by the processing system 104 may be monitored to identify transitions/changes in power load/state. In such an example, when the processing system 104 performs greater than a threshold number of processes, then the thermal setpoint can be switched to a higher thermal setpoint, and vice versa.

In some implementations, the controller 116 may be configured to a set thermal setpoint that is selected from a plurality of predetermined candidate thermal setpoints. Any suitable number of candidate thermal setpoints may be predetermined for the operational temperature range of the device 100. In one example, the controller 116 may select from three or more predetermined candidate thermal setpoints. In other implementations, the controller 116 may be configured to dynamically calculate the thermal setpoints based at least in part on the power load and the temperature. The controller 116 may be configured to dynamically calculate the thermal setpoints to correspond to any suitable temperature within an operational temperature range of the device 100. Moreover, the controller 116 may be configured to dynamically calculate the thermal setpoints in response to any suitable change in operating conditions of the device 100. For example, the controller 116 may be configured to dynamically calculate the thermal setpoints in response to on/off state of the device, on/off state of the processing system, beginning/ending of processing threads/task/processes, error conditions, operating flags, and other computing events. In another example, the controller 116 may be configured to dynamically calculate the thermal setpoints based at least in part on changes in operation of different modes (power states) that vary from a highest (or simultaneous) function of the device, to various modes that are constrained functionally. Non-limiting examples in which a mode may be functionally constrained include limiting a number of active processing units or cores (CPU, GPU, etc.), reducing the operational frequency of the active processing units, reducing a speed of the processing units, reducing the speed of internal or external interfaces (e.g., reducing the interface to main memory by running the interface at a slower speed, or putting at least a portion the interface in self-refresh mode), and shutting off particular functional blocks completely and removing power from the functional blocks if the functional block are not being used. Since such different modes or states are known to the device 100, the controller 116 may be configured to recognize a change in mode or state, and dynamically determine the cooling setpoint based at least in part on the recognized change in mode or state.

It will be appreciated that the controller 116 may dynamically calculate a thermal setpoint based on operating conditions of the device 100 at any suitable time during operation of the device 100. In one example, the controller 116 dynamically calculates the thermal setpoint according to a designated period. In another example, the controller 116 dynamically calculates the thermal setpoint according to a trigger or event. For example, the controller 116 may dynamically calculate the thermal setpoint based at least in part upon an operating parameter changing by a threshold amount.

In some implementations, the thermal setpoints may be determined based at least in part on a determined corresponding acoustic response curve of the cooling system 102. Further, in some implementations, the controller 116 may be configured to determine the corresponding acoustic response curve of the cooling system 102, and recognize the change in operating mode or state, and dynamically determine the setpoint such that the cooling system 102 operates according to the desired acoustic characteristics in the recognized mode or state. Example acoustic response curves of the cooling system 102 are discussed in more detail below with reference to FIGS. 3 and 4.

The cooling system 102 may be configured to thermally regulate the processing system 104 in any suitable manner. For example, the cooling system 102 may be an active cooling system that circulates a coolant (e.g., air or liquid) throughout the processing system 104 to transfer heat away from the processing system 104.

In some implementations, the cooling system 102 includes a fan configured to circulate air through the processing system 104. In some such implementations, the controller 116 adjusts the response of the cooling system 102 by adjusting the fan response as a function of temperature based at least in part on the currently set thermal setpoint. In one particular example, the controller 116 includes a proportional-integral-derivative (PID) controller configured to receive the power load and the temperature as inputs and output a pulse-width-modulated (PWM) duty cycle based at least in part on the power load and the temperature. Further, the controller 116 may control operation of the fan according to the PWM duty cycle. For example, the PWM duty cycle may be adjusted to adjust a speed of the fan. In such an example, the gains of the PID controller may be designed based at least in part on the power/cooling characteristics of the components of the processing system 104.

It will be appreciated that the cooling system 102 may thermally regulate any suitable portion of the device 100. In some implementations, the cooling system 102 may include multiple cooling fans that are distributed throughout the device 100. In some such implementations, the controller 116 may be configured to control each cooling fan of the multiple cooling fans separately (e.g., based at least in part on separate thermal setpoints) to provide a desired response of the cooling system 102 to thermally regulate the different portions of the device 100.

In some implementations, the cooling system 102 includes a liquid cooling circuit configured to circulate liquid coolant (e.g., water) through the processing system 104 and/or other components of the device 100 via operation of a pumping device. In some such implementations, the controller 116 adjusts the response of the cooling system 102 by adjusting a pump response as a function of temperature based at least in part on the currently set thermal setpoint. Further, in some examples, different thermal setpoints may be set based at least in part on different determined corresponding acoustic response curves of the pumping device.

In other implementations, the cooling system 102 may be a passive cooling system. As one example, the passive cooling system may instruct the processing system 104 to throttle operation, shut down power consuming tasks/processes/units, do less work, and/or take other actions to reduce a power load. Such commands may allow the processing system 104 to generate less heat during operation in order cool the device temperature based at least in part on the thermal setpoint. In yet other implementations, the cooling system 102 may include a combination of active and passive cooling components to thermally regulate the processing system 104.

Figure 2:
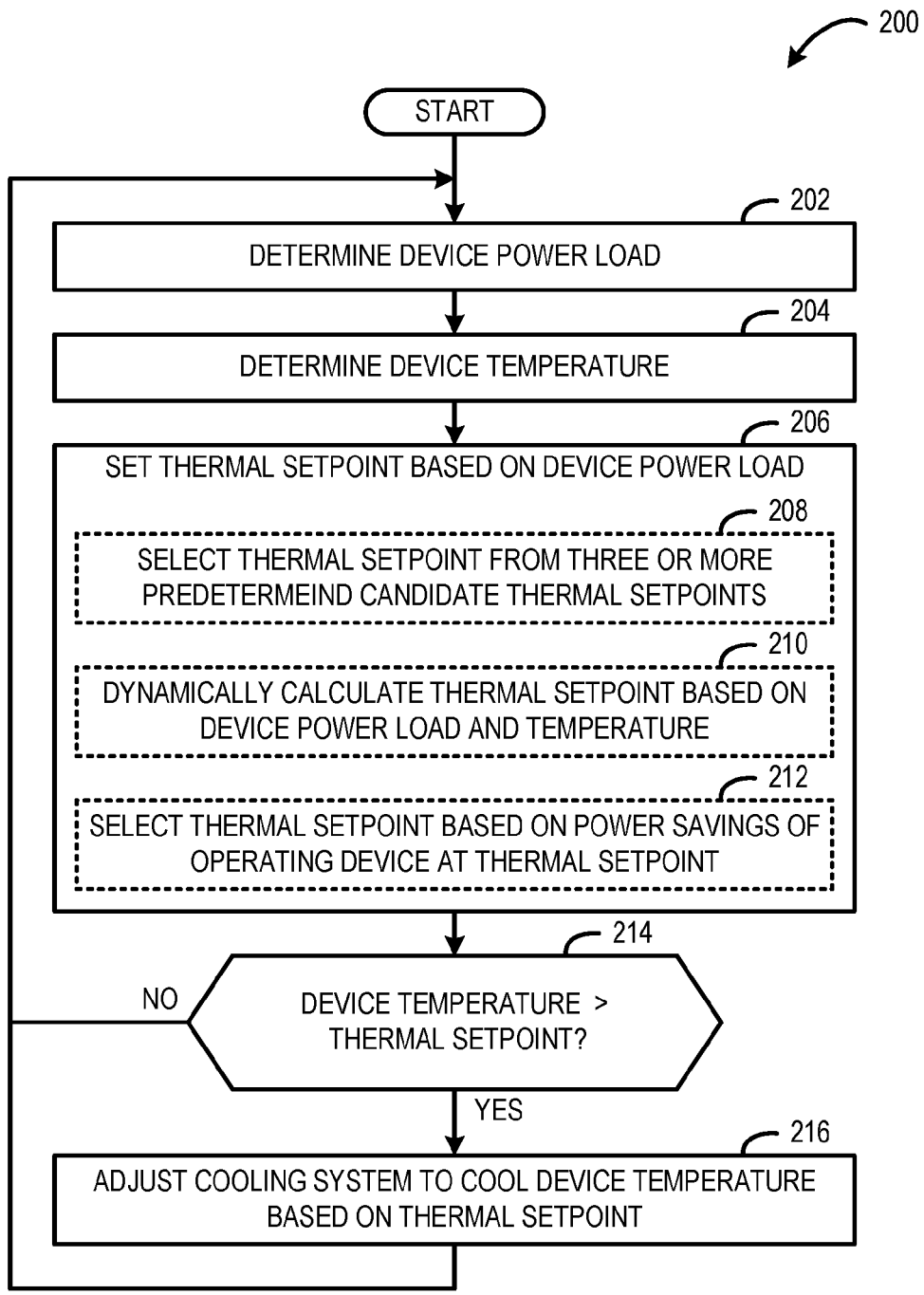
FIG. 2 shows a flow diagram depicting an example method of controlling a cooling system for a device.

FIG. 2 shows a flow diagram depicting an example method 200 of controlling a cooling system for a device, such as the cooling system 102 of the device 100 of FIG. 1. For example, the method 200 may be performed by the controller 116 of FIG. 1. At 202, the method 200 includes determining a power load of the device. For example, the power load may be determined based at least in part on signals received from power sensors embedded in the device (e.g., integrated into a voltage regulator of the device). In one example, the power load is determined by calculating a moving average of a plurality of power load samples acquired during a designated duration (e.g., a window of 5 samples) from the power sensors.

At 204, the method 200 includes determining a temperature of the device. For example, the temperature of the device may be determined based at least in part on signals received from one or more thermal sensors embedded in the device (e.g., diodes placed at different locations to measure different electrical junction temperatures).

At 206, the method 200 includes setting a thermal setpoint for the device based at least in part on the power load of the device. In some implementations, at 208, the thermal setpoint may be set by selecting a thermal setpoint from a three or more predetermined candidate thermal setpoints (e.g., high, medium, and low thermal setpoints). In other implementations, at 210, the thermal setpoint may be set by optionally dynamically calculating a thermal setpoint based at least in part on the device power load and temperature. In some implementations, at 212, the thermal setpoint may be set optionally based at least in part on a potential power savings of operating the device at the selected thermal setpoint. In particular, because a portion of the power load of a device is associated with the temperature of the device (e.g., the leakage power), there is a power advantage to being able to cool the device temperature based at least in part on a lower thermal setpoint, as lowering the device temperature requires at least some power to be consumed in the cooling system (e.g., power used to operate a fan in a fan-cooled device). For example, it may be desirable to stay at a cooler temperature when taking into account the amount of energy required to cool the device from a higher thermal setpoint back down to the lower thermal setpoint. Such an approach may be particularly useful in devices having a limited power supply, such as battery-powered devices that spend significant amounts of time in lower power states in order to conserve battery power. In any of these implementations, the thermal setpoint may be determined based at least in part on an acoustic response curve of the cooling system as a function of power load at that setpoint.

At 214, the method 200 includes determining whether the device temperature is greater than the currently set thermal setpoint. If the device temperature is greater than the thermal setpoint, then, at 216, the cooling system response is adjusted to cool the device temperature based at least in part on the thermal setpoint. In one example where the cooling system includes a fan, the speed of the fan can be adjusted to cool the device temperature based at least in part on the thermal setpoint. Otherwise, if the device temperature is not greater than the thermal setpoint, such cooling steps are not taken. In either case, the method returns to begin anew.

The method 200 may be performed continuously to monitor the power load and temperature of the device and dynamically adjust the thermal setpoint in response to a change in the power load. Additionally, the response of the cooling system may be continuously adjusted to cool the device temperature based at least in part on the currently set thermal setpoint. Accordingly, the method 200 may be performed to provide an appropriate thermal response for the current operating conditions of the device in a manner that addresses reliability and acoustic impact dynamically.

Figure 3:
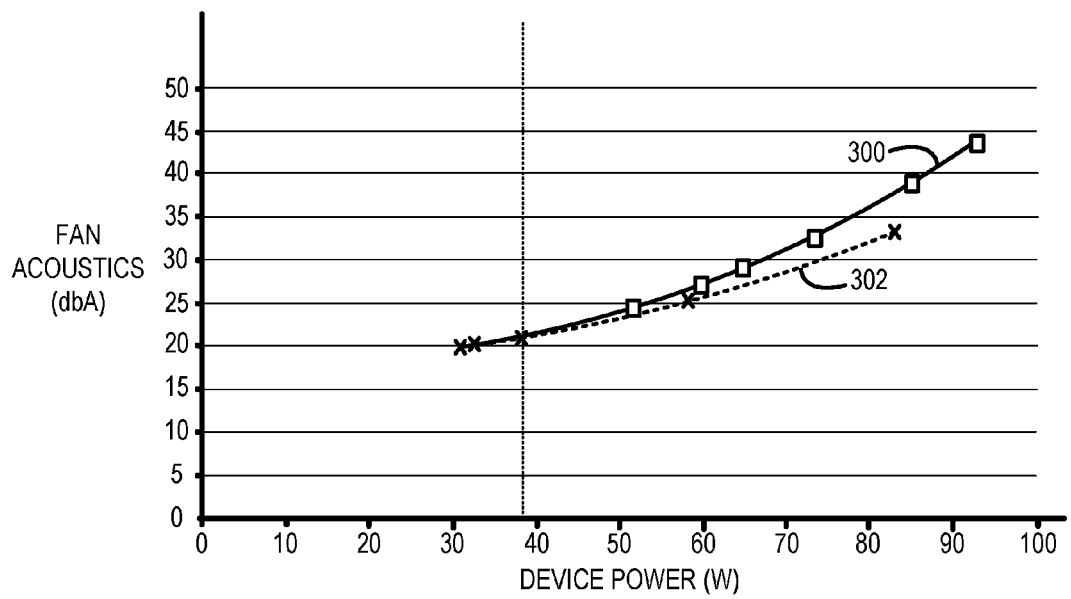
FIG. 3 shows a graph comparing an acoustic response curve of a cooling system responding to a first thermal setpoint relative to a desired acoustic response curve in an example device.
Figure 4:
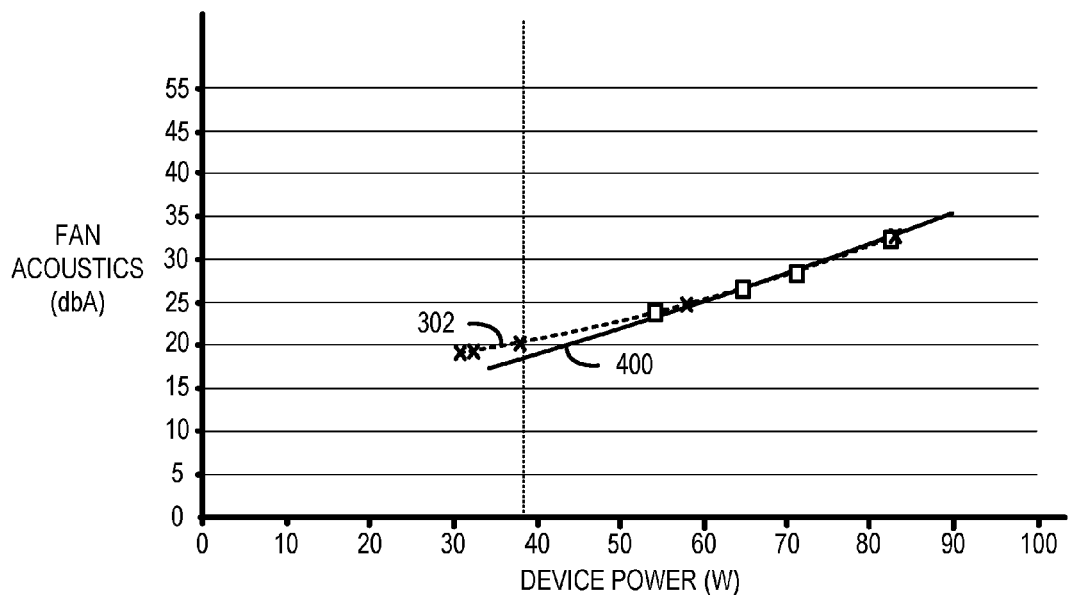
FIG. 4 shows a graph comparing an acoustic response curve of a cooling system responding to a second thermal setpoint relative to a desired acoustic response curve in an example device.

FIGS. 3 and 4 shows graphs comparing different example acoustic response curves of a fan of an example cooling system. The acoustic response curves characterize the acoustic behavior of the fan while responding to different thermal setpoints relative to a desired acoustic response curve of the cooling system. Each graph plots an SOC power load measured in watts (W) vs fan acoustics measured in decibels (dBA). The desired acoustic response curve may be determined in any suitable manner. In particular, the desired acoustic response curve may be specific to the particular type of device. For example, a laptop computing device may have a lower desired acoustic response curve than a server computing device.

In FIG. 3, an actual acoustic response curve 300 of the fan is configured to cool the device temperature based at least in part on a lower thermal setpoint. Under lower power load conditions, the actual acoustic response curve 300 matches a desired acoustic response curve 302. However, at approximately 38 Ws, the actual acoustic response curve 300 becomes greater than the desired acoustic response curve 302. In other words, when the power load of the device reaches approximately 38 Ws while operating at the lower thermal setpoint, the fan acoustics become louder that desired. Accordingly, a threshold power load is set at approximately 38 W to adjust the thermal setpoint to a higher thermal setpoint in order to shift the actual acoustic response curve 302 to be not greater than the desired acoustic response curve 300. In other words, by adjusting the thermal setpoint to the higher thermal setpoint, the resulting operation of the fan based at least in part on the higher thermal setpoint may produce quieter fan acoustics that are within a desired acoustic range.

In FIG. 4, an actual acoustic response curve 400 of the fan is configured to cool the device temperature based at least in part on the higher thermal setpoint. By switching to the higher thermal setpoint in response to the power load exceeding the threshold power load, the actual acoustic response curve 400 corresponding to the higher thermal setpoint matches (or is below) the desired acoustic response curve 302 even as power load increases under high power load conditions.

In FIGS. 3 and 4, a scenario is shown in which two different thermal setpoints are used in a manner that optimizes an acoustic response of a fan. In some implementations, three or more different thermal setpoints may be used in such a manner in order to further tailor the acoustic response of the fan with even more granularity throughout various ranges of power load of the device. In some such implementations, the three or more thermal setpoints may be predetermined. In other such implementations, the three or more thermal setpoints may be dynamically calculated. Any suitable number of different thermal setpoints may be dynamically set during operation of the device to optimize the acoustic response of the fan while maintaining reliable operation of the device.

In some implementations, the above described multi-thermal setpoint approach may additionally consider power savings when switching between thermal setpoints. In particular, because a portion of the power load of a device is associated with the temperature of the device (e.g., the leakage power), there is a power advantage to being able to cool the device temperature based at least in part on a lower thermal setpoint, as getting to a lower temperature requires at least some power to be consumed in the cooling system (e.g., power used to operate a fan in a fan-cooled device). Accordingly, is some cases, an overall power savings may be considered when determining whether to switch to a higher thermal setpoint. In particular, it may be desirable to stay at a cooler temperature when taking into account the amount of energy required to cool the device from a higher thermal setpoint back down to the lower thermal setpoint. Such an approach may be particularly useful in devices having a limited power supply, such as battery-powered devices that spend significant amounts of time in lower power states in order to conserve battery power.

Figure 5:
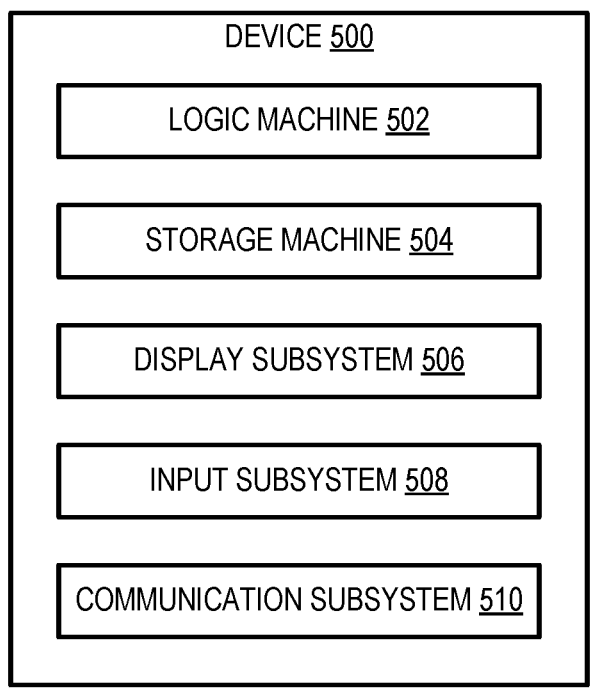
FIG. 5 shows a block diagram of another example computing system.

FIG. 5 schematically shows a non-limiting implementation of a device 500 that can enact one or more of the methods and processes described above. Device 500 is shown in simplified form. Device 500 may take the form of one or more personal computers, server computers, tablet computers, home-entertainment computers, network computing devices, gaming devices, mobile computing devices, mobile communication devices (e.g., smart phone), and/or other computing devices. For example, device 500 is an example of device 100 of FIG. 1.

Device 500 includes a logic machine 502 and a storage machine 504. Device 500 may optionally include a display subsystem 506, input subsystem 508, communication subsystem 510, and/or other components not shown in FIG. 5.

Logic machine 502 includes one or more physical devices configured to execute instructions. For example, the logic machine 502 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine 502 may include one or more processors configured to execute software instructions. Additionally or alternatively, the logic machine 502 may include one or more hardware or firmware logic machines configured to execute hardware or firmware instructions. Processors of the logic machine 502 may be single-core or multi-core, and the instructions executed thereon may be configured for sequential, parallel, and/or distributed processing. Individual components of the logic machine 502 optionally may be distributed among two or more separate devices, which may be remotely located and/or configured for coordinated processing. Aspects of the logic machine 502 may be virtualized and executed by remotely accessible, networked computing devices configured in a cloud-computing configuration.

Storage machine 504 includes one or more physical devices configured to hold instructions executable by the logic machine 502 to implement the methods and processes described herein. When such methods and processes are implemented, the state of storage machine 504 may be transformed—e.g., to hold different data.

Storage machine 504 may include removable and/or built-in devices. Storage machine 504 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 504 may include volatile, nonvolatile, dynamic, static, read/write, read-only, random-access, sequential-access, location-addressable, file-addressable, and/or content-addressable devices.

It will be appreciated that storage machine 504 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 502 and storage machine 504 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 506 may be used to present a visual representation of data held by storage machine 504. This visual representation may take the form of a graphical user interface (GUI). As the herein described methods and processes change the data held by the storage machine 504, and thus transform the state of the storage machine 504, the state of display subsystem 506 may likewise be transformed to visually represent changes in the underlying data. Display subsystem 506 may include one or more display devices utilizing virtually any type of technology. Such display devices may be combined with logic machine 502 and/or storage machine 504 in a shared enclosure, or such display devices may be peripheral display devices.

When included, input subsystem 508 may comprise or interface with one or more user-input devices such as a keyboard, mouse, touch screen, or game controller. In some implementations, the input subsystem 508 may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 510 may be configured to communicatively couple device 500 with one or more other computing devices. Communication subsystem 510 may include wired and/or wireless communication devices compatible with one or more different communication protocols. As non-limiting examples, the communication subsystem 510 may be configured for communication via a wireless telephone network, or a wired or wireless local- or wide-area network. In some implementations, the communication subsystem 510 may allow device 500 to send and/or receive messages to and/or from other devices via a network such as the Internet.

In an example, a method for controlling a cooling system for a device, comprises determining a power load of the device, setting a first thermal setpoint based at least in part on the power load, the first thermal setpoint being based at least in part on a determined first corresponding acoustic response curve, determining a temperature of the device, adjusting a response of the cooling system based at least in part on the first thermal setpoint, detecting a change in the power load of the device to a higher power load having a higher magnitude acoustic response on the first corresponding acoustic response curve, in response to detecting the change in the power load to the higher power load, setting a second thermal setpoint having a lower magnitude acoustic response at the higher power load, the second thermal setpoint being based at least in part on a determined second corresponding acoustic response curve, and adjusting the response of the cooling system based at least in part on the second thermal setpoint. In this example and/or other examples, the change in power load may be a first change in power load, and the method may further comprises after setting the second thermal setpoint, detecting a second change in the power load of the device from the higher power load, based at least in part on detecting the second change in power load, setting another thermal setpoint that differs from the second thermal setpoint; and adjusting the response of the cooling system based at least in part on the other thermal setpoint. In this example and/or other examples, the other thermal setpoint maybe the first thermal setpoint. In this example and/or other examples, the power load of the device may be determined as a moving average of a plurality of power load samples acquired during a designated duration. In this example and/or other examples, the device may comprise a processing system, and the power load may comprise the power load of the processing system. In this example and/or other examples, the cooling system may include a fan, and the first corresponding acoustic response curve and the second corresponding acoustic response curve may be based at least on fan acoustics. In this example and/or other examples, adjusting the response of the cooling system may include adjusting a fan response as a function of temperature. In this example and/or other examples, the cooling system may be controlled by a proportional-integral-derivative (PID) controller configured to receive the power load and the temperature as inputs and output a pulse-width-modulated (PWM) duty cycle based at least in part on the power load and the temperature to control the fan.

In an example, a method for controlling a cooling system for a device, comprises determining a power load of the device, determining a temperature of the processing system, based at least in part on the power load being less than a first threshold power load, setting a first thermal setpoint selected from three or more candidate thermal setpoints based at least in part on the power load, and when the temperature of the processing system is greater than the first thermal setpoint, adjust a response of the cooling system to lower the temperature of the processing system to less than the first thermal setpoint, based at least in part on the power load being not less than the first threshold power load and the power load being less than a second threshold power load, setting a second thermal setpoint selected from the three or more candidate thermal setpoints based at least in part on the power load, the second thermal setpoint greater than the first thermal setpoint, and based at least in part on the temperature of the processing system being greater than the second thermal setpoint, adjusting the response of the cooling system to lower the temperature of the processing system to less than the second thermal setpoint and based at least in part on the power load being not less than the second threshold power load, setting a third thermal setpoint selected from the three or more candidate thermal setpoints based at least in part on the power load, the third thermal setpoint greater than the second thermal setpoint, and based at least in part on the temperature of the processing system being greater than the third thermal setpoint, adjusting the response of the cooling system to lower the temperature of the processing system to less than the third thermal setpoint. In this example and/or other examples, the power load of the device may be determined as a moving average of a plurality of power load samples acquired during a designated duration. In this example and/or other examples, the device may include a central processing unit (CPU) and a graphics processing unit (GPU), and the power load of the processing system may include a linear fit estimate based at least in part on one or more of a power load of the CPU and a power load of the GPU. In this example and/or other examples, the cooling system may include an active cooling system. In this example and/or other examples, the active cooling system may include a fan. In this example and/or other examples, adjusting the response of the active cooling system may include adjusting a speed of the fan. In this example and/or other examples, the active cooling system may be controlled by a proportional-integral-derivative (PID) controller configured to receive the power load and the temperature as inputs and output a pulse-width-modulated (PWM) duty cycle based at least in part on the power load and the temperature to control the speed of the fan. In this example and/or other examples, adjusting the response of the passive cooling system includes throttling operation of a processing system.

In an example, a device comprises a processing system, a cooling system for cooling the processing system, and a controller configured to, determine a power load of the processing system, determine a temperature of the processing system, dynamically calculate a first thermal setpoint based at least in part on the power load and the temperature, adjust a response of the cooling system based at least in part on the first thermal setpoint, based at least in part on the power load becoming greater than a threshold power load, dynamically calculate a second thermal setpoint different than the first thermal setpoint based at least in part on the power load and the temperature, and adjust the response of the cooling system based at least in part on the second thermal setpoint. In this example and/or other examples, the response of the cooling system may be characterized by an actual acoustic response curve, and the controller may be further configured to, based at least in part on the actual acoustic response curve becoming greater than a desired acoustic response curve, dynamically calculate the second thermal setpoint based at least in part on the power load and the temperature, and adjust the response of the cooling system to cool the temperature of the processing system based at least in part on the second thermal setpoint. In this example and/or other examples, the cooling system may include a fan, and adjusting the response of the cooling system may include adjusting a speed of the fan. In this example and/or other examples, the device may include a central processing unit (CPU) and a graphics processing unit (GPU), and the power load of the processing system may include a linear fit estimate based at least in part on one or more of a power load of the CPU and a power load of the GPU.

It will be understood that the configurations and/or approaches described herein are exemplary in nature, and that these specific implementations or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for controlling a cooling system for a device, the method comprising:
    determining a power load of the device;
    setting a first thermal setpoint based at least in part on the power load, the first thermal setpoint being based at least in part on a determined first corresponding acoustic response curve;
    determining a temperature of the device;
    adjusting a response of the cooling system based at least in part on the first thermal setpoint;
    detecting a change in the power load of the device to a higher power load having a higher magnitude acoustic response on the first corresponding acoustic response curve;
    in response to detecting the change in the power load to the higher power load, setting a second thermal setpoint having a lower magnitude acoustic response at the higher power load, the second thermal setpoint being based at least in part on a determined second corresponding acoustic response curve; and
    adjusting the response of the cooling system based at least in part on the second thermal setpoint.

2. The method of claim 1, wherein the change in power load is a first change in power load, and the method further comprising:
    after setting the second thermal setpoint, detecting a second change in the power load of the device from the higher power load;
    based at least in part on detecting the second change in power load, setting another thermal setpoint that differs from the second thermal setpoint; and
    adjusting the response of the cooling system based at least in part on the other thermal setpoint.

3. The method of claim 2, wherein the other thermal setpoint is the first thermal setpoint.

4. The method of claim 1, wherein the power load of the device is determined as a moving average of a plurality of power load samples acquired during a designated duration.

5. The method of claim 1, wherein the device comprises a processing system, and wherein the power load comprises the power load of the processing system.

6. The method of claim 1, wherein the cooling system includes a fan, and wherein the first corresponding acoustic response curve and the second corresponding acoustic response curve are based at least on fan acoustics.

7. The method of claim 6, wherein adjusting the response of the cooling system includes adjusting a fan response as a function of temperature.

8. The method of claim 7, wherein the cooling system is controlled by a proportional-integral-derivative (PID) controller configured to receive the power load and the temperature as inputs and output a pulse-width-modulated (PWM) duty cycle based at least in part on the power load and the temperature to control the fan.

9. A method for controlling a cooling system for a device, the method comprising:
    determining a power load of the device;
    determining a temperature of the processing system;
    based at least in part on the power load being less than a first threshold power load, setting a first thermal setpoint selected from three or more candidate thermal setpoints based at least in part on the power load, and when the temperature of the processing system is greater than the first thermal setpoint, adjust a response of the cooling system to lower the temperature of the processing system to less than the first thermal setpoint;
    based at least in part on the power load being not less than the first threshold power load and the power load being less than a second threshold power load, setting a second thermal setpoint selected from the three or more candidate thermal setpoints based at least in part on the power load, the second thermal setpoint greater than the first thermal setpoint, and based at least in part on the temperature of the processing system being greater than the second thermal setpoint, adjusting the response of the cooling system to lower the temperature of the processing system to less than the second thermal setpoint; and
    based at least in part on the power load being not less than the second threshold power load, setting a third thermal setpoint selected from the three or more candidate thermal setpoints based at least in part on the power load, the third thermal setpoint greater than the second thermal setpoint, and based at least in part on the temperature of the processing system being greater than the third thermal setpoint, adjusting the response of the cooling system to lower the temperature of the processing system to less than the third thermal setpoint.

10. The method of claim 9, wherein the power load of the device is determined as a moving average of a plurality of power load samples acquired during a designated duration.

11. The method of claim 9, wherein the device includes a central processing unit (CPU) and a graphics processing unit (GPU), and wherein the power load of the processing system includes a linear fit estimate based at least in part on one or more of a power load of the CPU and a power load of the GPU.

12. The method of claim 9, wherein the cooling system includes an active cooling system.

13. The method of claim 12, wherein the active cooling system includes a fan.

14. The method of claim 13, wherein adjusting the response of the active cooling system includes adjusting a speed of the fan.

15. The method of claim 14, wherein the active cooling system is controlled by a proportional-integral-derivative (PID) controller configured to receive the power load and the temperature as inputs and output a pulse-width-modulated (PWM) duty cycle based at least in part on the power load and the temperature to control the speed of the fan.

16. The method of claim 9, wherein adjusting the response of the passive cooling system includes throttling operation of a processing system.

17. A device comprising:
    a processing system;
    a cooling system for cooling the processing system and having a response characterized by an actual acoustic response curve; and
    a controller configured to:
        determine a power load of the processing system;
        determine a temperature of the processing system;
        dynamically calculate a first thermal setpoint based at least in part on the power load and the temperature;
        adjust a response of the cooling system based at least in part on the first thermal setpoint;
        based at least in part on the power load becoming greater than a threshold power load and the actual acoustic response curve becoming greater than a desired acoustic response curve, dynamically calculate a second thermal setpoint different than the first thermal setpoint based at least in part on the power load and the temperature; and
        adjust the response of the cooling system based at least in part on the second thermal setpoint.

18. The device of claim 17, wherein the cooling system includes a fan, and wherein adjusting the response of the cooling system includes adjusting a speed of the fan.

19. The device of claim 17, wherein the device includes a central processing unit (CPU) and a graphics processing unit (GPU), and wherein the power load of the processing system includes a linear fit estimate based at least in part on one or more of a power load of the CPU and a power load of the GPU.

* * * * *